(12) United States Patent
Doi

(10) Patent No.: US 6,784,520 B2
(45) Date of Patent: Aug. 31, 2004

(54) SEMICONDUCTOR DEVICES CONSTITUTE CONSTANT VOLTAGE DEVICES USED TO RAISE INTERNAL VOLTAGE

(75) Inventor: Hiroyuki Doi, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/411,268

(22) Filed: Apr. 11, 2003

(65) Prior Publication Data

US 2003/0197206 A1 Oct. 23, 2003

(30) Foreign Application Priority Data

Apr. 18, 2002 (JP) ........................................ 2002-115859

(51) Int. Cl.[7] .................... H01L 29/861; H01L 31/107; H01L 29/30; H01L 29/866; H01L 29/88
(52) U.S. Cl. ........................ 257/603; 257/106; 257/605; 257/606
(58) Field of Search ................................ 257/106, 603, 257/605, 606

(56) References Cited

U.S. PATENT DOCUMENTS 5,150,176 A * 9/1992 Schoenberg ................ 257/496
6,040,617 A * 3/2000 Patel ........................... 257/571
6,639,301 B2 * 10/2003 Andoh ........................ 257/606

FOREIGN PATENT DOCUMENTS

| JP | 08-181334 | 7/1996 |
| JP | 11-26600 | 1/1999 |
| JP | 11-307787 | 11/1999 |

* cited by examiner

*Primary Examiner*—Ngân V. Ngô
(74) *Attorney, Agent, or Firm*—McDermott, Will & Emery

(57) ABSTRACT

A constant voltage device includes n-type and p-type doped layers. The n-type doped layer is formed by heavily doping with an n-type impurity an upper portion of a p-type silicon semiconductor substrate, in an active region defined by an isolating insulator film. The p-type doped layer is formed by doping the region under the n-type doped layer with a p-type impurity. The n-type and p-type doped layers are provided to form two layers in parallel with the substrate surface of the semiconductor substrate, whereby a pn junction formed between the n-type and p-type doped layers creates a diode structure. Impurity concentration in the p-type doped layer is established so that the impurity concentration of a portion adjacent the isolating insulator film is lower that that of the rest.

24 Claims, 9 Drawing Sheets

SEMICONDUCTOR DEVICES CONSTITUTE CONSTANT VOLTAGE DEVICES USED TO RAISE INTERNAL VOLTAGE

BACKGROUND OF THE INVENTION

The present invention generally relates to semiconductor devices for use in semiconductor integrated circuits, and more particularly relates to semiconductor devices that are formed in integrated circuits and constitute constant voltage devices used to raise internal voltage, for example. The present invention also relates to methods for fabricating the semiconductor devices.

In a booster provided inside an integrated circuit, a constant voltage device, which is called a "clamping diode", has been conventionally used to fix an increased voltage at a given voltage. Such a constant voltage device, also known as a Zener diode, uses the reverse breakdown phenomenon that occurs at a pn junction formed by a semiconductor substrate and a doped layer formed in the semiconductor substrate in order to obtain a given constant voltage.

(First Conventional Case)

Hereinafter, a constant voltage device in accordance with a first conventional case will be described with reference to FIG. 7. As shown in FIG. 7, the constant voltage device of the first conventional case includes an n-type doped layer 103 and a p-type doped layer 104. The n-type doped layer 103 is formed by doping with n-type impurity ions a part of the upper portion of a p-type semiconductor substrate 101, in an active region 100 surrounded by an isolating oxide film 102. The p-type doped layer 104 is formed by doping the remaining part thereof with p-type impurity ions. In this case, a pn junction is formed in the substantially central portion of the active region 100 by the n-type and p-type doped layers 103 and 104.

An interlevel dielectric film 105 is formed on the semiconductor substrate 101. In the interlevel dielectric film 105, plugs 106 of tungsten are formed to be electrically connected to the n-type and p-type doped layers 103 and 104, respectively. Further, interconnects 107 made of aluminum are formed on the interlevel dielectric film 105 in such a manner that the interconnects 107 establish connection with the respective plugs 106.

In the constant voltage device of the first conventional case, the constant voltage of the device is determined by the reverse breakdown voltage at the pn junction formed by the n-type and p-type doped layers 103 and 104. Specifically, when a reverse voltage exceeding the constant voltage is applied to the region between the n-type and p-type doped layers 103 and 104, the reverse current resulting from the Zener effect or the avalanche effect flows between the n-type and p-type doped layers 103 and 104. This phenomenon allows the voltage between the n-type and p-type doped layers 103 and 104 to be substantially maintained at a constant voltage, even if a large voltage is applied.

(Second Conventional Case)

Next, a constant voltage device in accordance with a second conventional case will be described with reference to FIG. 8. The constant voltage device shown in FIG. 8 has a structure in which a pn junction is formed between a p-type semiconductor substrate 101 and an n-type doped layer 103 formed in an upper portion of an active region 100 in the p-type semiconductor substrate 101.

In the constant voltage device of the second conventional case, the constant voltage of the device is determined by the reverse breakdown voltage at the pn junction formed by the n-type doped layer 103 and the semiconductor substrate 101. Specifically, when a reverse voltage exceeding the constant voltage is applied between an aluminum interconnect 107 and the p-type semiconductor substrate 101, the resulting reverse current due to the Zener effect or the avalanche effect flows between the semiconductor substrate 101 and the n-type doped layer 103. Even if a large voltage is applied, the voltage between the aluminum interconnect 107 and the semiconductor substrate 101 is thus substantially maintained at a constant value.

The constant voltage devices of the first and second conventional cases both have the following problems, however.

First, in the constant voltage device of the first conventional case, the doped layers 103 and 104 of the mutually differing conductivity types are both formed side by side in the semiconductor-substrate 101 active region 100 in a planar direction of the substrate principal surface, leading to the problem that the constant voltage device accounts for a large area in an integrated circuit. Further, since the constant voltage of the device is determined by the reverse breakdown voltage applied to the pn junction that is the interface formed between the n-type and p-type doped layers 103 and 104, impurity concentration in at least one of the n-type and p-type doped layers 103 and 104 has to be adjusted in order to obtain a desired constant voltage.

In the constant voltage device of the second conventional case, on the other hand, the doped layer is of n-type alone, allowing the area occupied by the device in an integrated circuit to be reduced. As mentioned above, however, the constant voltage of the device is determined by the reverse breakdown voltage applied to the pn junction, that is, the interface formed between the n-type doped layer 103 and the p-type semiconductor substrate 101. Thus, as in the first conventional case, impurity concentration in at least one of the semiconductor substrate 101 and the n-type doped layer 103 has to be adjusted in order to obtain a desired constant voltage.

Nevertheless, generally, in integrated circuits, an n-type doped layer 103, a p-type doped layer 104, or a semiconductor substrate 101 is often used as a well shared by other semiconductor devices. Thus, the level of freedom at which impurity concentration in the n-type doped layer 103, p-type doped layer 104, or semiconductor substrate 101 may be independently adjusted is low. Consequently, it is very difficult to establish an intended constant voltage for the constant voltage device.

Moreover, the constant voltage devices of the first and second conventional cases also have the problem that the reverse breakdown voltage changes with time.

FIG. 9A shows the relationship between duration of applied constant current stress and variation in reverse breakdown voltage in the constant voltage devices of the first and second conventional cases. FIG. 9B shows the relationship between time for which the constant voltage devices are left to stand under high temperature conditions after constant current stress has been applied, and variation in reverse breakdown voltage. It should be understood that the conditions under which the measurements shown in FIG. 9A were carried out include an applied current of 200 $\mu$A and an evaluation temperature of 125° C. The measurements shown in FIG. 9B were made under conditions in which a current of 2 mA was applied for 3.5 hours, and thereafter the constant voltage devices were left to stand under a temperature of 150° C. The line plotted with circles represents the first conventional case, while the line plotted with triangles represents the second conventional case. As can be seen from FIGS. 9A and 9B, the variation in the constant voltage is as much as 1 to 1.2 V in the first conventional case, and the variation in the constant voltage is about 0.7 to 0.9 V in the second conventional case.

SUMMARY OF THE INVENTION

The present invention was made in view of the conventional problems, and it is therefore an object thereof to facilitate obtaining a desired constant voltage in a semiconductor device, while reducing the area occupied by the device, and at the same time to prevent reverse breakdown voltage therein from varying with time.

In order to achieve the object, a semiconductor device according to the present invention has a structure in which in at least one of p-type and n-type doped layers that form a pn junction, a portion adjacent to (in the vicinity of) an isolation film has a lower impurity concentration than the other portion.

Such a structure allows the position at which reverse breakdown occurs in the pn junction to be kept apart from the region adjacent to the isolation film, which, according to the following findings, prevents variation in reverse breakdown voltage with time.

The present inventor, after making various studies as to why it is difficult to obtain a desired constant voltage, that is, a desired design voltage for a clamping diode and other semiconductor devices and as to the cause of the large variation with time indicated in FIGS. 9A and 9B, reached the following conclusions and findings.

First, the case with the constant voltage device of the first conventional case will be described.

In the constant voltage device of the first conventional case shown in FIG. 7, a reverse breakdown phenomenon caused by a reverse voltage applied to the n-type and p-type doped layers 103 and 104 creates electron-hole pairs at the pn junction (identified by the reference mark A) formed by n-type and p-type doped layers 103 and 104. Holes, for the most part, of the electron-hole pairs are injected into the interlevel dielectric film 105 on the p-type doped layer 104 through a portion of the p-type doped layer 104 located in the vicinity of the pn junction. On the other hand, electrons of the electron-hole pairs are injected into the interlevel dielectric film 105 on the n-type doped layer 103 through a portion of the n-type doped layer 103 located in the vicinity of the pn junction. This results in increase in the reverse breakdown voltage such that the reverse breakdown voltage varies due to application of constant current stress as shown in FIG. 9A.

As shown in FIG. 9A, however, there are cases in which despite the fact that a junction breakdown phenomenon has occurred at the top end of the pn junction, the reverse breakdown voltage apparently does not vary. This is because electrons and holes are both injected into the interlevel dielectric film 105 at an early stage and neutralize the electric field. The reverse breakdown voltage therefore does not vary.

Even in such a case, however, when the constant voltage device is left to stand under high temperature conditions (150° C.) after constant current stress has been applied, the electrons, easy to be released by heat, are rapidly released from the interlevel dielectric film 105 into other portions before the holes are released, thereby causing the reverse breakdown voltage to increase as shown in FIG. 9B.

Next, the case with the constant voltage device of the second conventional case shown in FIG. 8 will be described.

FIGS. 1A through 1C are enlarged views showing boundary portions between the isolating oxide film 102 and the pn junction formed by the p-type semiconductor substrate 101 and the n-type doped layer 103.

As shown in FIG. 1A, when a voltage exceeding the reverse breakdown voltage is applied, electron-hole pairs are created due to the reverse breakdown phenomenon at the pn junction formed by the n-type doped layer 103 and the p-type semiconductor substrate 101. Since the semiconductor substrate 101 has an impurity concentration lower than the n-type doped layer 103, the depletion layer expands more on the semiconductor substrate 101 side than on the n-type doped layer 103 side. Further, the breakdown voltage in the pn junction plane is lowest in a portion thereof in contact with the isolating oxide film 102, in which portion the junction breakdown therefore happens. As a result, holes, for the most part, of the electron-hole pairs generated by the breakdown phenomenon are injected from a portion of the semiconductor substrate 101 located in the vicinity of the pn junction edge into the isolating oxide film 102 adjacent to the pn junction edge. On the other hand, electrons of the electron-hole pairs are injected from a portion of the n-type doped layer 103 located in the vicinity of the pn junction edge into the isolating oxide film 102 adjacent to the pn junction edge. Consequently, as shown in FIG. 1B, the injected electrons and holes act to expand the depletion layer. Where the depletion layer is in the p-type semiconductor substrate 101 having the lower impurity concentration than the n-type doped layer 103, in particular, expands more, whereby the electric field in the depletion layer in the vicinity of the isolating oxide film 102 is weakened. This results in increasing the reverse breakdown voltage, between the n-type doped layer 103 (or the aluminum interconnect 107) and the semiconductor substrate 101, required to increase the voltage between the p-type semiconductor substrate 101 and the n-type doped layer 103 up to the reverse breakdown voltage at the pn junction.

For the above reasons, the variation in the reverse breakdown voltage due to application of constant current stress shown in FIG. 9A is caused.

Moreover, as shown in FIG. 1C, when the constant voltage device is left to stand under high temperature conditions after constant current stress has been applied, the depletion layer further expands in a portion in the pn junction in the vicinity of the isolating oxide film 102 because the electrons are easy to be released from the isolating oxide film 102 by heat. As mentioned above, these are the reasons why the reverse breakdown voltage varies when the constant voltage device is left to stand under high temperature conditions after constant current stress has been applied, as shown in FIG. 9B. Semicircles and semi-ellipses shown in the isolating oxide film 102 in FIGS. 1A through 1C are graphs respectively schematically representing relationships between electron/hole density and location.

As mentioned above, in a semiconductor integrated circuit incorporating either type of conventional constant voltage device, the reverse breakdown voltage varies as compared to its given constant voltage. The constant voltage device thus cannot fulfill its functions as a constant voltage device.

In view of these facts, the present inventor reached the findings that when a constant voltage device has a structure in which doped layers forming a pn junction are provided as first and second doped layers forming a two-layer-stacked structure perpendicular with respect to the substrate surface of a semiconductor substrate, a desired constant voltage can be easily obtained while the area occupied by the constant voltage device in an integrated circuit is reduced. Further, the present inventor discovered that in the constant voltage device of the second conventional case, the reverse breakdown phenomenon that occurs at the pn junction occurs in the vicinity of the isolating oxide film. Based on this, he found out that if impurity concentration is adjusted in at least one of the first and second doped layers so that a portion thereof located in the vicinity of the isolation film has a lower impurity concentration than the rest, variation in the reverse breakdown voltage with time can be controlled.

Specifically, an inventive semiconductor device includes: a semiconductor region defined by an isolation film; a first doped layer formed in the semiconductor region and having a conductivity type different than the semiconductor region; and a second doped layer formed in the semiconductor region in such a manner that the second doped layer is in contact with an upper or lower side of the first doped layer and that an end portion of the second doped layer is in contact with the isolation film. The second doped layer has the same conductivity type as the semiconductor region. A portion of the second doped layer adjacent the isolation film has an impurity concentration lower that the remaining portion of the second doped layer.

In the inventive semiconductor device, the position at which reverse breakdown occurs in the pn junction can be kept apart from the isolation film. Electrons and holes generated by junction breakdown are thus prevented from being injected into the isolation film, thereby preventing variation in the reverse breakdown voltage with time.

In the inventive semiconductor device, the second doped layer is preferably formed to cover the lower side of the first doped layer.

In the inventive semiconductor device, the first doped layer is preferably formed in such a manner that the lateral of the first doped layer is spaced apart from the side face of the isolation film.

Then, the first doped layer is kept apart from the isolation film, as a result of which, the position in the pn junction at which reverse junction breakdown occurs can be completely separate from a portion adjacent the isolation film, thereby significantly suppressing electrons and holes generated by junction breakdown from being injected into the isolation film.

In that case, it is preferable that the second doped layer also covers the lateral of the first doped layer.

Further, in that case, the first doped layer is preferably formed in an upper portion of the semiconductor region, the second doped layer preferably reaches the surface of the semiconductor region, and in the second doped layer, a portion in the vicinity of that surface preferably has a lower impurity concentration than the other portion, except the portion adjacent the isolation film.

In the inventive semiconductor device, the semiconductor region is preferably a substrate made of semiconductor, the first doped layer is preferably formed in an upper portion of the substrate, and a plug that is electrically connected to the first doped layer is preferably formed on the first doped layer.

In the inventive semiconductor device, the second doped layer is preferably formed by rotational implant (angled implant) of an impurity from at least three directions.

An inventive method for fabricating a semiconductor device includes the steps of: (a) selectively forming an isolation film in a semiconductor region, (b) forming a first doped layer having a conductivity type different than the semiconductor region, in an area located in the semiconductor region and surrounded by the isolation film, and (c) forming a second doped layer having the same conductivity type as the semiconductor region, in the semiconductor region in such a manner that the second doped layer is in contact with the isolation film and the first doped layer. In the step (c), impurity ions are implanted at angles with respect to the normal to the surface of the semiconductor region, from at least three mutually differing directions, thereby forming the second doped layer in which a portion adjacent the isolation film has a lower impurity concentration than the remaining portion.

According to the inventive semiconductor device fabrication method, an inventive semiconductor device in which a portion of a second doped layer adjacent to an isolation film has a lower impurity concentration than the remaining portion of the second doped layer, is reliably obtained.

The inventive semiconductor device fabrication method preferably further includes, between the steps (a) and (b), the step (d) of forming a mask pattern on the active area located in the semiconductor region and surrounded by the isolation film so that the mask pattern masks a peripheral portion of the active area. In the step (b), the first doped layer is preferably formed by implanting impurity ions with the mask pattern used as a mask.

In the inventive semiconductor device fabrication method, in the step (c), it is preferable that the second doped layer is also formed in a portion in the active area located between the first doped layer and the isolation film.

In the inventive semiconductor device fabrication method, in the step (b), the first doped layer is preferably formed in an upper portion of the active area, and in the step (c), the impurity ions are preferably implanted in such a manner that the second doped layer reaches the surface of the active area, and that in the second doped layer, a portion in the vicinity of that surface has a lower impurity concentration than the remaining portion, except the portion adjacent the isolation film.

In the inventive semiconductor device fabrication method, in the step (c), the angles with respect to the normal of the semiconductor region are preferably not less than 20 degrees.

An inventive semiconductor device includes a first doped layer and a second doped layer.

An inventive semiconductor device includes an active layer and an isolating insulator film directly connected to said active layer. Said active layer includes a high-concentration doped layer directly connected to a low-concentration doped layer having a conductivity type different than said high-concentration doped layer. A first portion of said low-concentration doped layer adjacent said isolating insulator film has an ion concentration lower than another portion of said low-concentration doped layer.

The inventive device preferably further includes an offset region located between at least a part of an outer surface of said high-concentration doped layer and said isolating insulator film.

In the inventive device, said offset region preferably includes a portion of said low-concentration doped layer.

In the inventive device, a second portion of said low-concentration doped layer adjacent a top surface of said low-concentration doped layer preferably has an ion concentration lower than another portion of said low-concentration doped layer.

In the inventive device, said low-concentration doped layer is preferably formed at least under the high-concentration doped layer.

An inventive semiconductor device includes a first doped layer and a second doped layer.

An inventive semiconductor device includes: a high-concentration doped layer, a low-concentration doped layer having a conductivity type different than said high-concentration doped layer, and an isolating insulator film. Said high-concentration doped layer is directly connected to said low-concentration doped layer and not directly connected to said isolating insulator film.

In the inventive device, a portion of said low-concentration doped layer is preferably between said isolating insulator film and said high-concentration doped layer.

In the inventive device, a portion of said low-concentration doped layer adjacent said isolating insulator film preferably has an ion concentration lower than another portion of said low-concentration doped layer.

In the inventive device, a portion of said low-concentration doped layer adjacent a top surface of said low-concentration doped layer preferably has an ion concentration lower than another portion of said low-concentration doped layer.

In the inventive device, said low-concentration doped layer is preferably formed at least under said high-concentration doped layer.

An inventive method for manufacturing a semiconductor device includes the steps of forming an isolating insulator film in a semiconductor substrate so that said isolating insulator film is connected to an active region, forming a high-concentration doped layer in the active region, and forming a low-concentration doped layer having a conductivity type different than said high-concentration doped layer so that said low-concentration doped layer is connected to said high-concentration doped layer in the active region. The step of forming a low-concentration doped layer includes forming a first portion of said low-concentration doped layer adjacent said isolating insulator film. The first portion has an ion concentration lower than another portion of said low-concentration doped layer.

In the inventive method, the step of forming a low-concentration doped layer is preferably performed by rotational ion-implantation with tilt.

In the inventive method, the tilt is preferably not less than 20 degrees with respect to a line perpendicular to the surface of said semiconductor substrate.

In the inventive method, the step of forming a high-concentration doped layer preferably includes forming an offset region located between at least a part of an outer surface of said high-concentration doped layer and said isolating insulator film.

In the inventive method, said offset region preferably includes a portion of said low-concentration doped layer.

In the inventive method, the step of forming a low-concentration doped layer preferably includes forming a second portion of said low-concentration doped layer adjacent a top surface of said low-concentration doped layer. The second portion has an ion concentration lower than another portion of said low-concentration doped layer.

In the inventive method, the step of forming a low-concentration doped layer preferably includes forming the low-concentration doped layer at least under the high-concentration doped layer.

An inventive method for manufacturing a semiconductor device includes the steps of: forming an isolating insulator film in a semiconductor substrate, forming a high-concentration doped layer in the semiconductor substrate in such a manner that said high-concentration doped layer is not directly connected to said isolating insulator film, and forming a low-concentration doped layer having a conductivity type different than said high-concentration doped layer in the semiconductor substrate so that low-concentration doped layer is directly connected to said high-concentration doped layer.

In the inventive method, the step of forming a low-concentration doped layer is preferably performed by rotational ion-implantation with tilt.

In the inventive method, the tilt is preferably not less than 20 degrees with respect to a line perpendicular to the surface of said semiconductor substrate.

In the inventive method, the step of forming a low-concentration doped layer preferably includes forming a portion of said low-concentration doped layer between said isolating insulator film and said high-concentration doped layer.

In the inventive method, the step of forming a low-concentration doped layer preferably includes forming a portion of said low-concentration doped layer adjacent said isolating insulator film. The portion has an ion concentration lower than another portion of said low-concentration doped layer.

In the inventive method, the step of forming a low-concentration doped layer preferably includes forming a portion of said low-concentration doped layer adjacent a top surface of said low-concentration doped layer. The portion has an ion concentration lower than another portion of said low-concentration doped layer.

In the inventive method, the step of forming a low-concentration doped layer preferably includes forming the low-concentration doped layer at least under the high-concentration doped layer.

BRIEF DESCRIPTION OF THE DRAWINGS

FIGS. 1A through 1C are used for giving explanations of reasons for a problem found in the semiconductor device. FIG. 1A is a view showing the semiconductor device immediately after junction breakdown has occurred. FIG. 1B is a view showing the semiconductor device when constant current stress is being applied. FIG. 1C is a view showing the semiconductor device when the device is left to stand under high temperature conditions after constant current stress has been applied.

FIG. 4A is a graph indicating the relationship between duration of applied constant current stress and variation in reverse breakdown voltage. FIG. 4B is a graph indicating the relationship between time for which the device is left to stand under high temperature conditions after constant current stress has been applied, and variation in reverse breakdown voltage.

FIG. 9A is a graph indicating the relationship between duration of applied constant current stress and variation in reverse breakdown voltage. FIG. 9B is a graph indicating the relationship between time for which the devices are left to stand under high temperature conditions after constant current stress has been applied, and variation in reverse breakdown voltage.

DESCRIPTION OF THE PREFERRED EMBODIMENTS

First Embodiment

Hereinafter, a first embodiment of the present invention will be described with reference to the accompanying drawings.

Figure 1A:
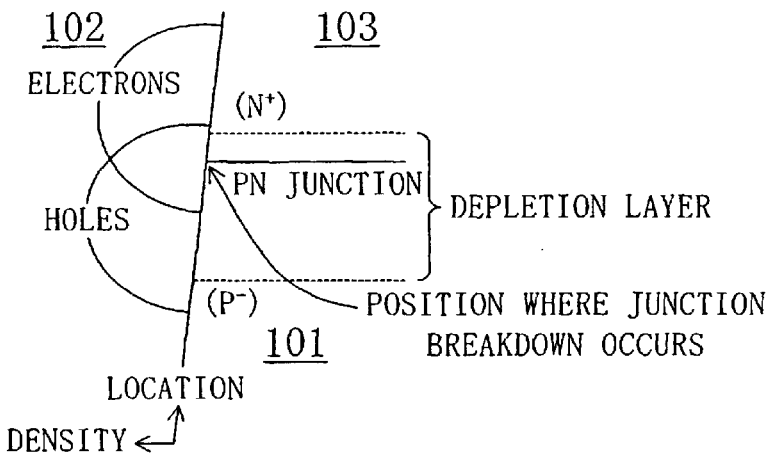
FIGS. 1A through 1C are views schematically showing cross sectional structures of, and carrier concentration in, a region including a pn junction and an isolating insulator film in a semiconductor device in accordance with a second conventional case.
Figure 1B:
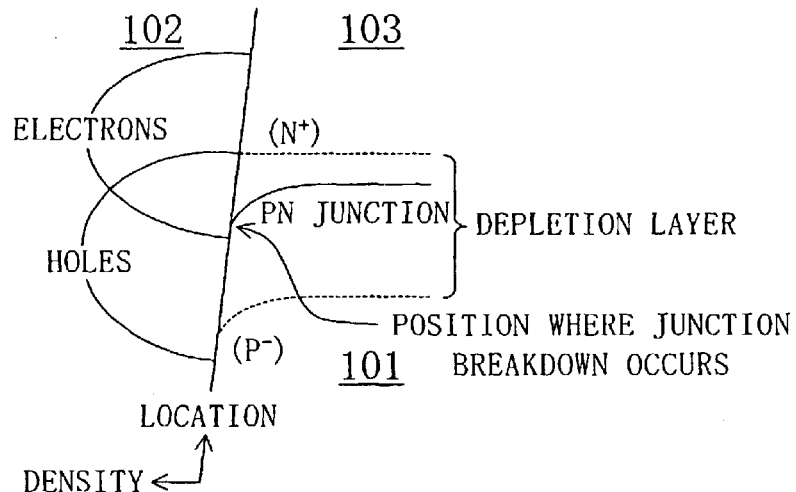
Figure 1C:
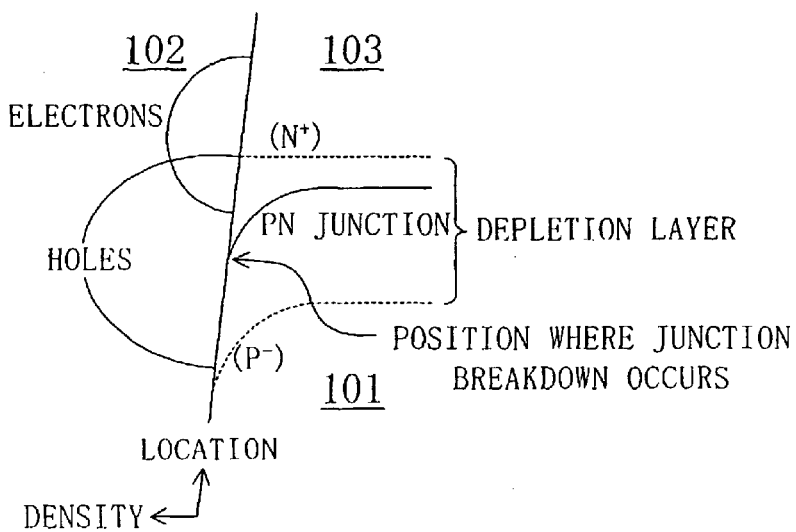
Figure 2A:
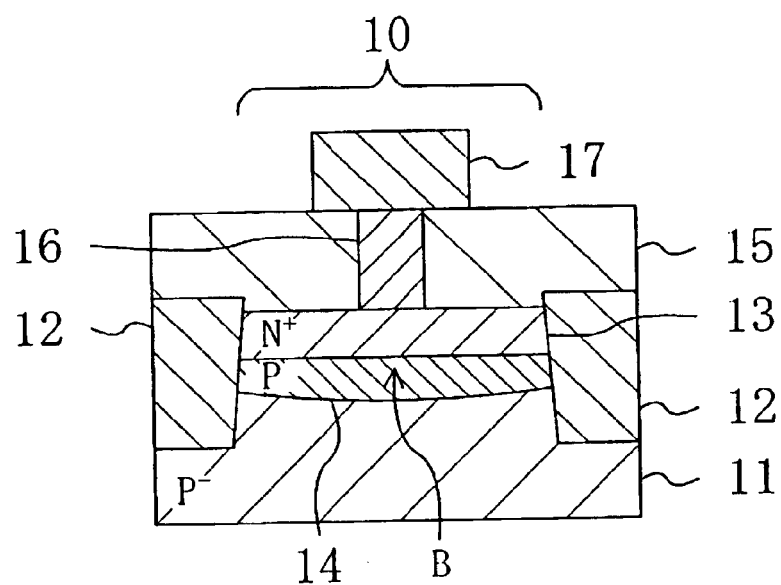
FIG. 2A shows a cross-sectional structure of a semiconductor device in accordance with a first embodiment of the present invention.

FIG. 2A shows a cross-sectional structure of a semiconductor device, which is a constant voltage device, in accordance with the first embodiment of the present invention.

As shown in FIG. 2A, the constant voltage device of the first embodiment includes an isolating insulator film 12, an n-type doped layer 13 and a p-type doped layer 14. The isolating insulator film 12 is made of a shallow trench isolation (STI) that is selectively formed in an upper portion of a semiconductor substrate 11 of p-type silicon (Si), for example. The n-type doped layer 13 is formed by heavily doping with an n-type impurity an upper portion of the semiconductor substrate 11, in an active region 10 defined by the isolating insulator film 12. The p-type doped layer 14 is formed by doping the region under the n-type doped layer 13 with a p-type impurity. The n-type and p-type doped layers 13 and 14 are provided forming two layers in the depth direction (perpendicular direction) with respect to the substrate surface of the semiconductor substrate 11. The pn junction formed by the n-type and p-type doped layers 13 and 14 creates a diode structure.

Figure 2B:
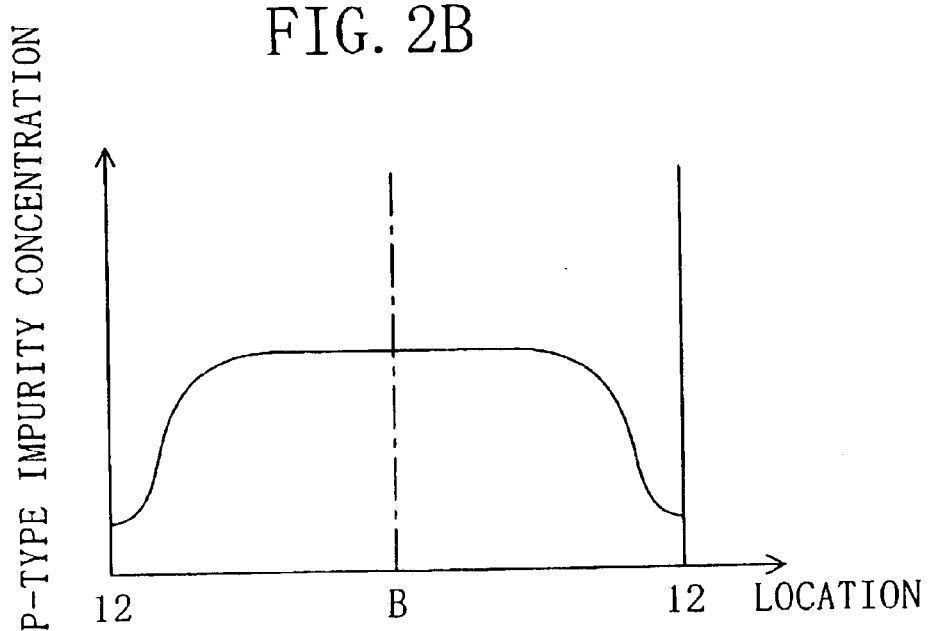
FIG. 2B shows an impurity-concentration profile for a p-type doped layer in the direction parallel to a substrate surface in the semiconductor device of the first embodiment of the present invention.

The first embodiment is characterized in that as shown in FIG. 2B, impurity concentration in the p-type doped layer 14 is established to exhibit an impurity-concentration profile in which a portion of the p-type doped layer 14 adjacent to the isolating insulator film 12 has a lower impurity concentration than the remaining portion (central portion) thereof.

An interlevel dielectric film 15 is formed over the entire active region 10 of the semiconductor substrate 11 as well as over the isolating insulator film 12. A plug 16 of tungsten (W) that is electrically connected to the n-type doped layer 13 is formed in the interlevel dielectric film 15. Further, an interconnect 17 of aluminum (Al) that is electrically connected to the plug 16 is formed on the interlevel dielectric film 15.

It will be described how to fabricate a constant voltage device having the above-described structure with reference to FIGS. 3A through 3D.

Figure 3A:
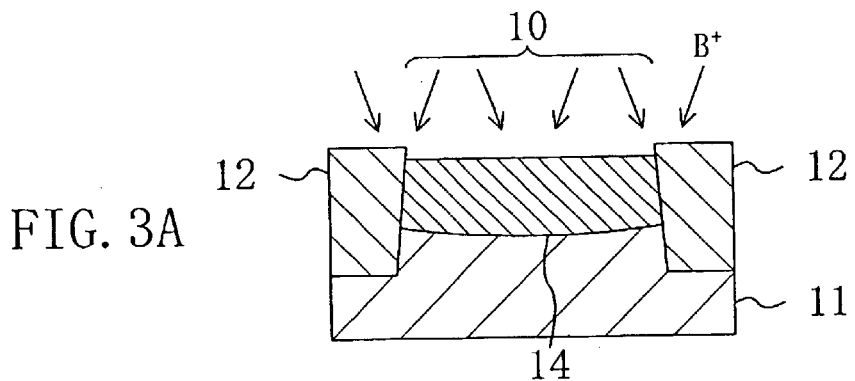
FIGS. 3A through 3D are cross sectional views illustrating process steps for fabricating the semiconductor device of the first embodiment of the present invention.

First, as shown in FIG. 3A, an isolating insulator film 12 is selectively formed in an upper portion of a p-type semiconductor substrate 11, thereby forming an active region 10 defined by the isolating insulator film 12. With the isolating insulator film 12 used as a mask, ions of boron ($B^+$) as a p-type impurity are then implanted into the entire surface of the semiconductor substrate 11 at an acceleration energy of 30 keV through 40 keV and at a dose on the order of $10^{12}$ $cm^{-2}$ to $10^{13}$ $cm^{-2}$. In this process step, the ions are implanted into the semiconductor substrate 11 at angles of 20° through 45° with respect to the normal to the substrate surface of the semiconductor substrate 11, from at least three directions (in this embodiment from four directions that are displaced by 90 degrees). In this manner, a p-type doped layer 14, in which the concentration of boron ions as impurity ions is on the order of $10^{18}$ $cm^{-3}$ and which is a reverse breakdown voltage regulating region, is formed.

Figure 3B:
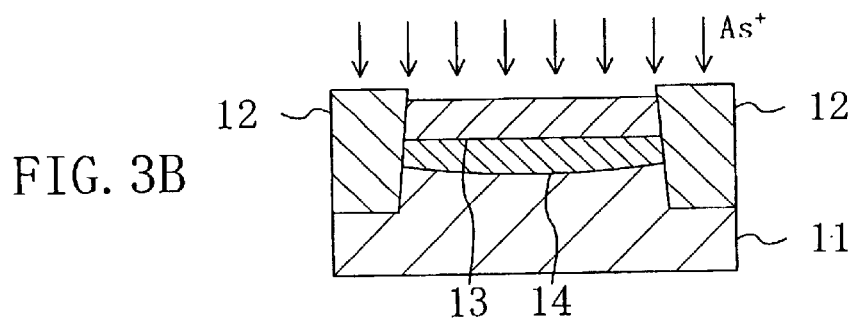

Next, as shown in FIG. 3B, with the isolating insulator film 12 used as a mask, ions of arsenic ($As^+$) as an n-type impurity are implanted into the entire surface of the semiconductor substrate 11 at an acceleration energy of 40 keV through 50 keV and at a dose on the order of $10^{15}$ $cm^{-2}$. In this manner, an n-type doped layer 13 having an impurity concentration on the order of $10^{20}$ $cm^{-3}$ is formed.

Figure 3C:
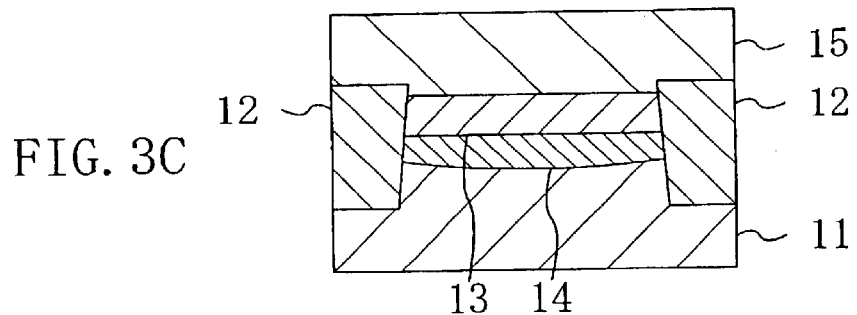

Subsequently, as shown in FIG. 3C, heat treatment such as annealing is performed in order to activate the implanted impurity ions, following which an interlevel dielectric film 15 of silicon oxide ($SiO_2$), for example, is deposited over the entire surface of the semiconductor substrate 11 by chemical vapor deposition (CVD) process, for example.

Figure 3D:
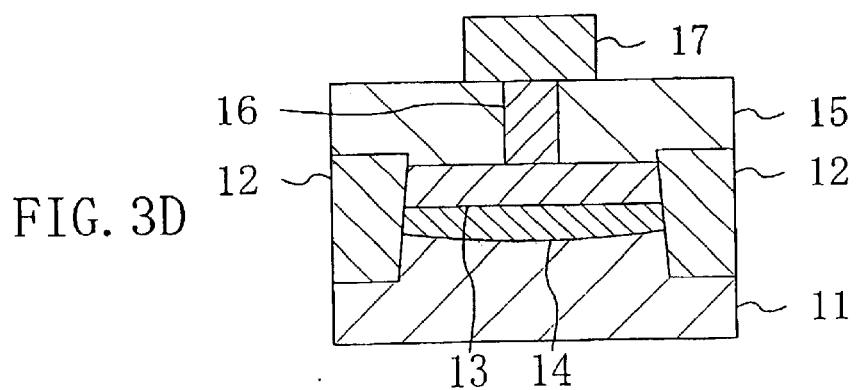

Then, as shown in FIG. 3D, a lithography and dry etching process is carried out so that a contact hole is formed in a portion of the interlevel dielectric film 15 that is located on the n-type doped layer 13, thereby exposing part of the n-type doped layer 13 through the contact hole. A sputtering or CVD process is then performed in order to fill the contact hole with tungsten, thereby forming a plug 16. Thereafter, an aluminum film is deposited on the interlevel dielectric film 15 by sputtering and then patterned in such a manner that the aluminum film is connected to the plug 16. In this way, an interconnect 17 of aluminum that is electrically connected to the n-type doped layer 13 through the plug 16 is formed on the interlevel dielectric film 15.

The constant voltage that determines the device characteristics for the constant voltage device is obtained by continuously applying a positive voltage to the n-type doped layer 13 via the interconnect 17 until the voltage between the n-type doped layer 13 and the semiconductor substrate 11 reaches the reverse breakdown voltage of a diode structure created by a pn junction formed between the n-type and p-type doped layers 13 and 14.

Unlike the second conventional case in which the pn junction is formed between the n-type doped layer 13 and the semiconductor substrate 11, the constant voltage device of the first embodiment has a structure in which the pn junction is formed between the n-type and p-type doped layers 13 and 14. This structure allows the boron-ion dose to be controlled in the boron-ion implantation process for forming the p-type doped layer 14, thereby easily adjusting impurity concentration in the p-type doped layer 14.

This makes it possible to easily adjust the reverse breakdown voltage at the diode structure created by the pn junction formed between the n-type and p-type doped layers 13 and 14, which means that in determining the constant voltage of the constant voltage device, a desired constant voltage can be easily obtained.

As described above, since semiconductor integrated circuits are often fabricated in such a manner that the semiconductor substrate 11 or the n-type doped layer 13 is used in common by other devices, how freely impurity concentration therein may be independently adjusted is very limited, regardless of whether either is n-type or p-type. In this respect, providing the p-type doped layer 14 whose impurity concentration can be easily adjusted is very effective in controlling and preventing variation in the reverse breakdown voltage in the diode structure.

Moreover, when the p-type doped layer 14 is formed in the semiconductor substrate 11, the p-type impurity ions are implanted into the semiconductor substrate 11 from the four directions that differ from each other, at angles of 20° through 45° with respect to the normal to the substrate surface. In the resultant p-type doped layer 14, therefore, the impurity concentration in the vicinity of the isolating insulator film 12 is lower than that of the rest.

This difference in the impurity concentration means that the position where reverse junction breakdown occurs in the diode structure created by the pn junction formed between the n-type and p-type doped layers 13 and 14, is kept apart from the isolating insulator film 12. This significantly suppresses electrons and holes generated by junction breakdown from being injected into the isolating insulator film 12, thereby decreasing the amount of electrons and holes that are injected into the isolating insulator film 12 per unit time. As a result, the rate at which the electric field in the direction going from the n-type doped layer 13 toward the p-type doped layer 14 is weakened with time, decreases at the pn junction edge adjacent to the isolating insulator film 12, and thus variation in the reverse breakdown voltage is further suppressed.

Figure 4A:
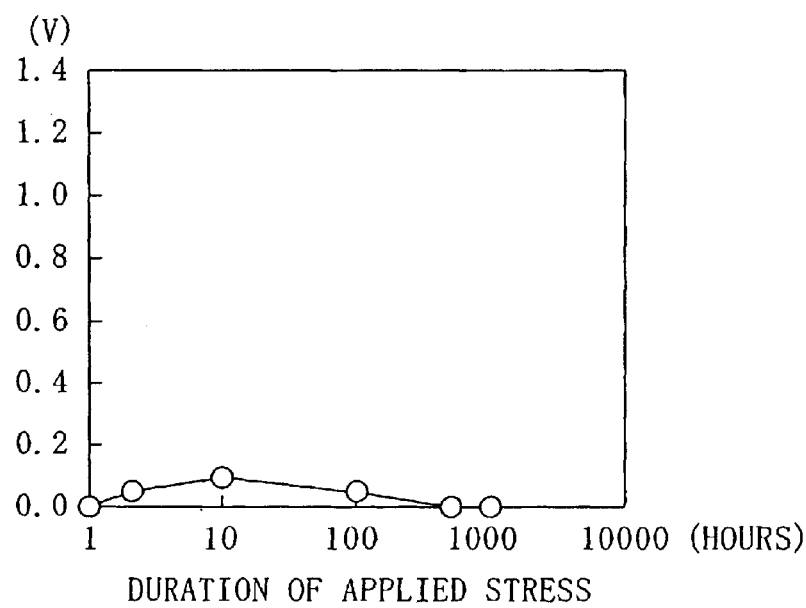
FIGS. 4A and 4B show results of reliability tests on the semiconductor device of the first embodiment of the present invention.
Figure 4B:
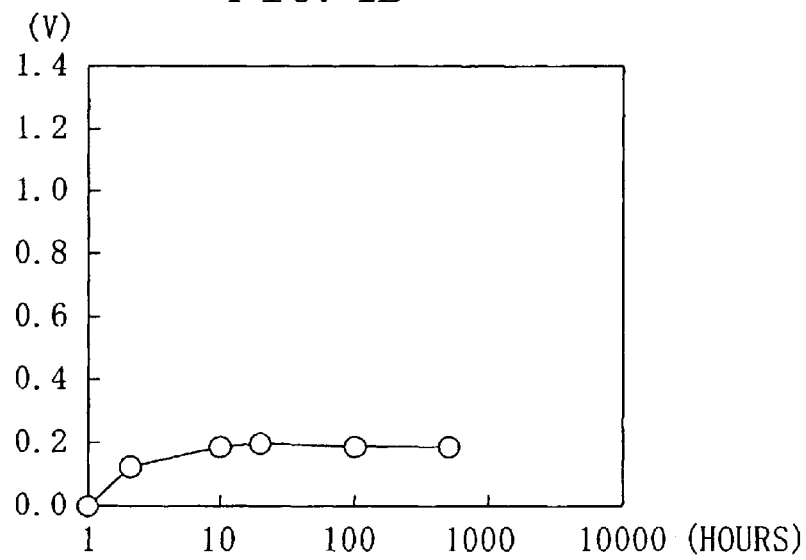

FIG. 4A shows the relationship between duration of applied constant current stress and variation in reverse breakdown voltage in the constant voltage device of the first embodiment. FIG. 4B shows the relationship between time for which the constant voltage device is left to stand under high temperature conditions after constant current stress has been applied, and variation in reverse breakdown voltage. It should be understood that the conditions under which the measurements shown in FIG. 4A were carried out include an applied current of 200 $\mu$A and an evaluation temperature of 125° C. The measurements shown in FIG. 4B were made under conditions in which a current of 2 mA was applied for 3.5 hours, and thereafter the constant voltage device was left to stand under a temperature of 150° C.

As can be seen from FIG. 4A, the variation in the reverse breakdown voltage with time can be controlled to be within 0.1 V in the constant voltage device of the first embodiment, even after the current stress has been applied for 1,000 hours.

Also, as shown in FIG. 4B, in this embodiment, the variation in the reverse breakdown voltage with time can be controlled to be about 0.2 V even after the constant voltage device has been left to stand under high temperature conditions for 500 hours after the application of the current stress.

As described above, in the semiconductor device (constant voltage device) of the first embodiment, the n-type and p-type doped layers 13 and 14 that form the diode structure are stacked in the direction perpendicular to the substrate surface, thereby reducing the area occupied by the constant voltage device, as well as facilitating control of the reverse breakdown voltage.

Moreover, in the ion-implantation process for forming the p-type doped layer 14, angled implant of ions is performed from at least three mutually differing directions, so that in the resultant p-type doped layer 14, the impurity concentration of a portion adjacent the isolating insulator film 12 is lower than that of the rest. In this manner, the position where junction breakdown occurs can be kept apart from the isolating insulator film 12. This considerably suppresses electrons and holes generated by junction breakdown from being injected into the isolating insulator film 12, thereby allowing variation in the reverse breakdown voltage with time to be suppressed.

In the first embodiment, only one plug 16 is formed to be connected to the n-type doped layer 13, however, the present invention is not limited thereto. A plurality of plugs may be formed for the n-type doped layer 13.

Also, the p-type doped layer 14 is formed so as to be in contact with the isolating insulator film 12 surrounding the p-type doped layer 14. The present invention, however, is not limited thereto, but the same effects can be achieved when the p-type doped layer 14 is formed away from the side face of the isolating insulator film 12.

Furthermore, the same effects are off course attainable when the p-type semiconductor substrate 11, the n-type doped layer 13 and the p-type doped layer 14 are each of the opposite conductivity.

In addition, although in this embodiment the ion implantation for forming the p-type doped layer 14 is carried out before performing the ion implantation for forming the n-type doped layer 13, the ion implantations may be performed in the reverse order.

Moreover, although the diode structure, that is, the active region 10, in the constant voltage device, is directly formed in the semiconductor substrate 11, the present invention is not limited thereto. The active region 10 may be provided in another semiconductor region formed on or over the semiconductor substrate 11.

Second Embodiment

Hereinafter, a second embodiment of the present invention will be described with reference to the accompanying drawings.

Figure 5:
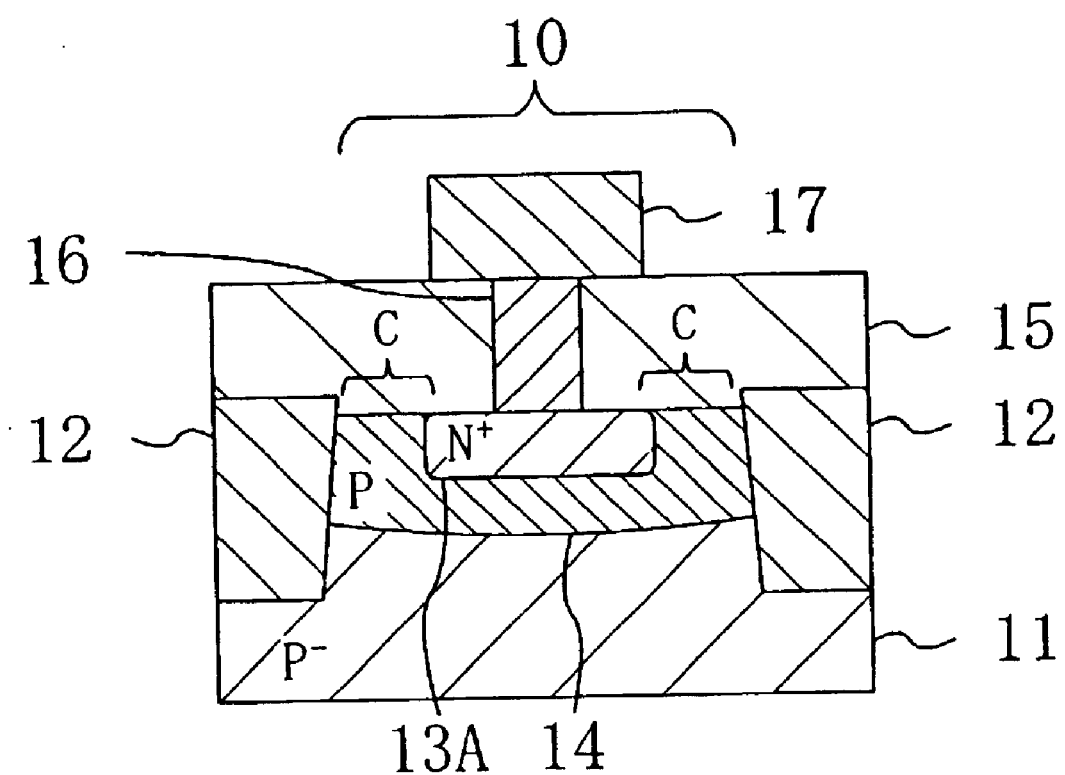
FIG. 5 shows a cross-sectional structure of a semiconductor device in accordance with a second embodiment of the present invention.

FIG. 5 shows a cross-sectional structure of a semiconductor device, which is a constant voltage device, in accordance with the second embodiment. In FIG. 5, the same members as those shown in FIG. 2A are identified by the same reference numerals and the description thereof will be omitted.

In the second embodiment, an n-type doped layer 13A is formed in an upper portion of an active region 10 in a semiconductor substrate 11 in such a manner that the n-type doped layer 13A is spaced apart from the side face of an isolating insulator film 12 by about 0.5 $\mu$m through 2 $\mu$m, thereby forming a so-called offset region C.

It will be described how to fabricate a constant voltage device having the above-described structure with reference to FIGS. 6A through 6D.

Figure 6A:
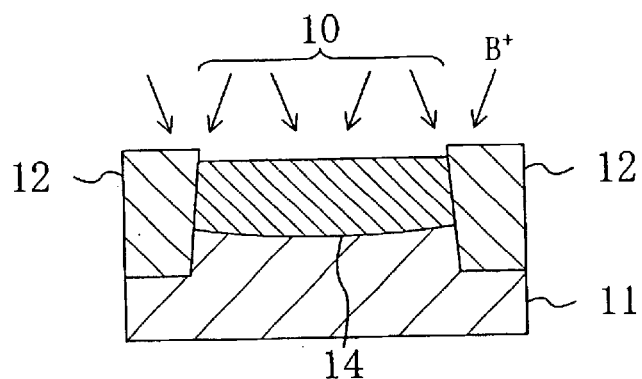
FIGS. 6A through 6D are cross sectional views illustrating process steps for fabricating the semiconductor device of the second embodiment of the present invention.

First, in the same manner as in the first embodiment, an isolating insulator film 12 is is selectively formed in an upper portion of a p-type semiconductor substrate 11, so that the isolating insulator film 12 defines an active region 10 as shown in FIG. 6A. With the isolating insulator film 12 used as a mask, ions of boron (B$^+$) are then implanted into the entire surface of the semiconductor substrate 11 at an acceleration energy of 30 keV through 40 keV and at a dose on the order of $10^{12}$ cm$^{-2}$ to $10^{13}$ cm$^{-2}$. In this process step, the ions are implanted into the semiconductor substrate 11 at angles of 20° through 45° with respect to the normal to the substrate surface of the semiconductor substrate 11, from at least three directions (in this embodiment from four directions that are displaced by 90 degrees). In this manner, a p-type doped layer 14 in which the concentration of boron ions as impurity ions is on the order of $10^{18}$ cm$^{-3}$ and which is a reverse breakdown voltage regulating region, is formed.

Figure 6B:
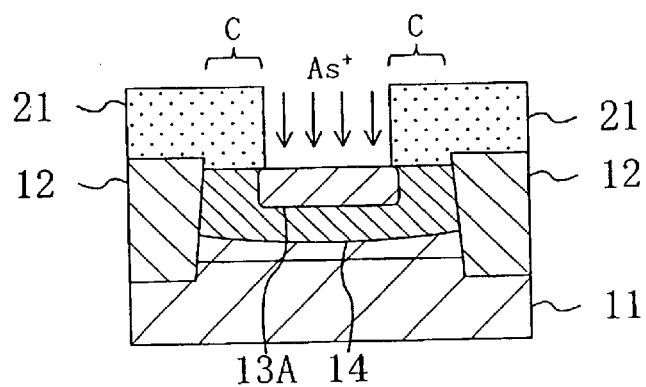

Next, as shown in FIG. 6B, a resist pattern 21 is formed on the active region 10 of the semiconductor substrate 11 by photolithography so that resist pattern 21 masks the peripheral portion of the active region 10 at a width of about 0.5 µm through 2 µm. Subsequently, with the resist pattern 21 used as a mask, ions of arsenic (As$^+$) are implanted into the active region 10 at an acceleration energy of 40 keV through 50 keV and at a dose on the order of $10^{15}$ cm$^{-2}$. In this way, an n-type doped layer 13A having an impurity concentration on the order of $10^{20}$ cm$^{-3}$ is formed with the offset region C interposed between the side face of the isolating insulator film 12 and the n-type doped layer 13A. Since the n-type doped layer 13A is formed island-like in an upper portion of the active region 10, the p-type doped layer 14 extends to the surface of the active region 10 to surround the n-type doped layer 13A, and in the p-type doped layer 14, the impurity concentration at or near that surface is lower than that of the rest, except in a portion adjacent the isolating insulator film 12.

Figure 6C:
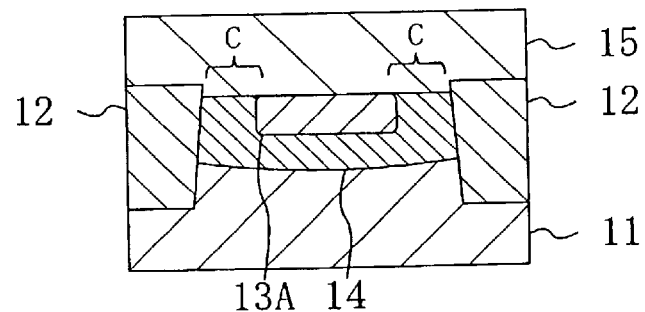

Subsequently, as shown in FIG. 6C, heat treatment such as annealing is performed in order to activate the implanted impurity ions, following which an interlevel dielectric film 15 of silicon oxide, for example, is deposited over the entire surface of the semiconductor substrate 11 by CVD process, for example.

Figure 6D:
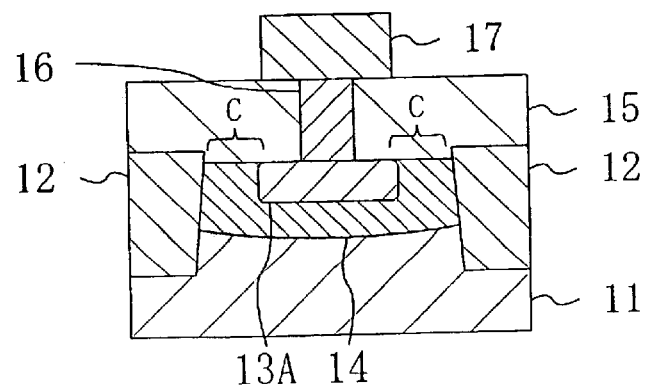
Figure 7:
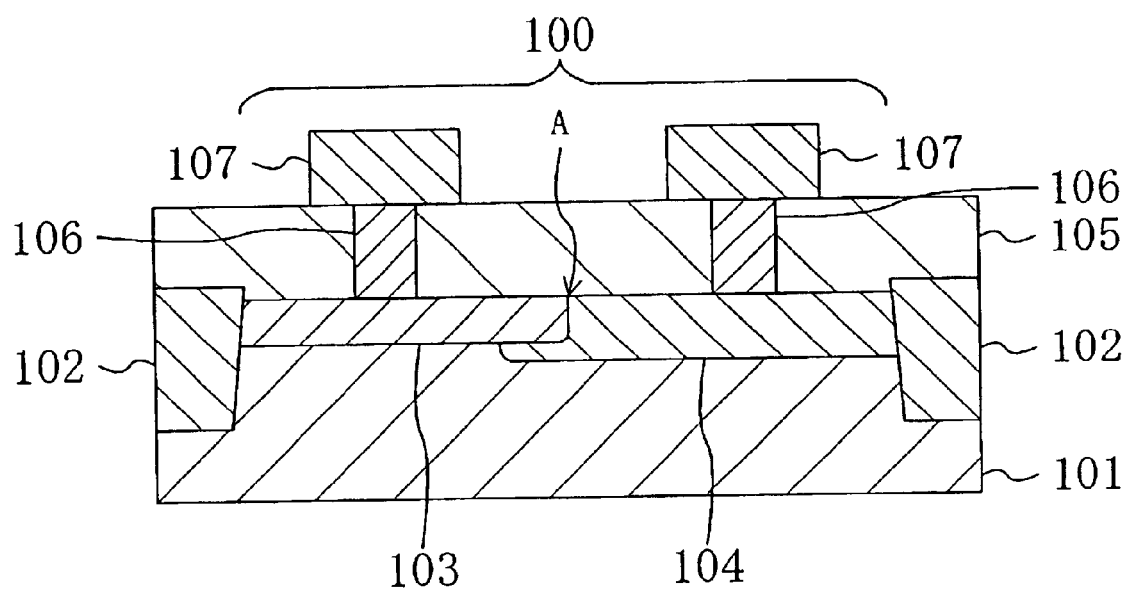
FIG. 7 is a view illustrating a cross sectional structure of a constant voltage device in accordance with a first conventional case.
Figure 8:
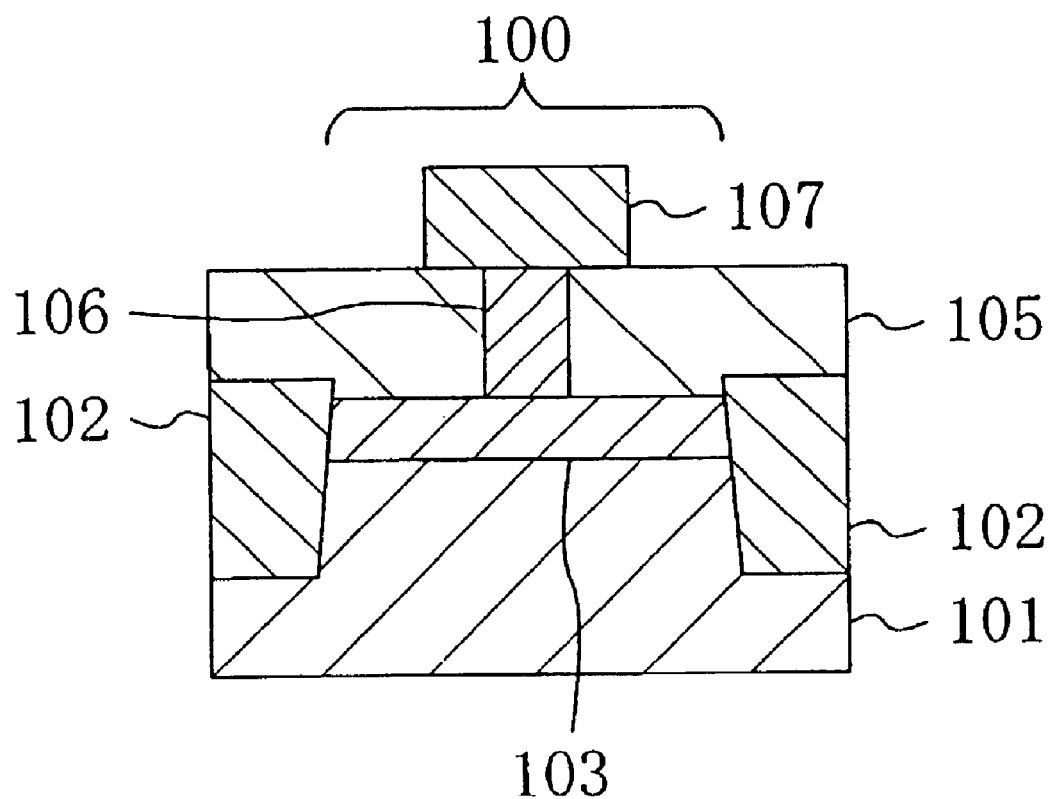
FIG. 8 is a view illustrating a cross sectional structure of the constant voltage device in accordance with the second conventional case.
Figure 9A:
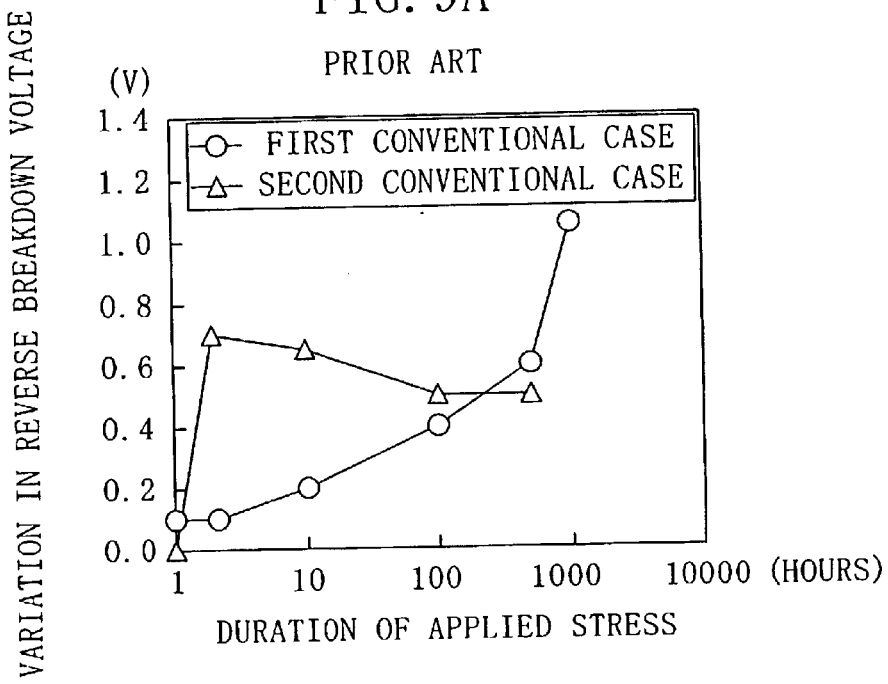
FIGS. 9A and 9B show results of reliability tests on the semiconductor devices of the first and second conventional cases.
Figure 9B:
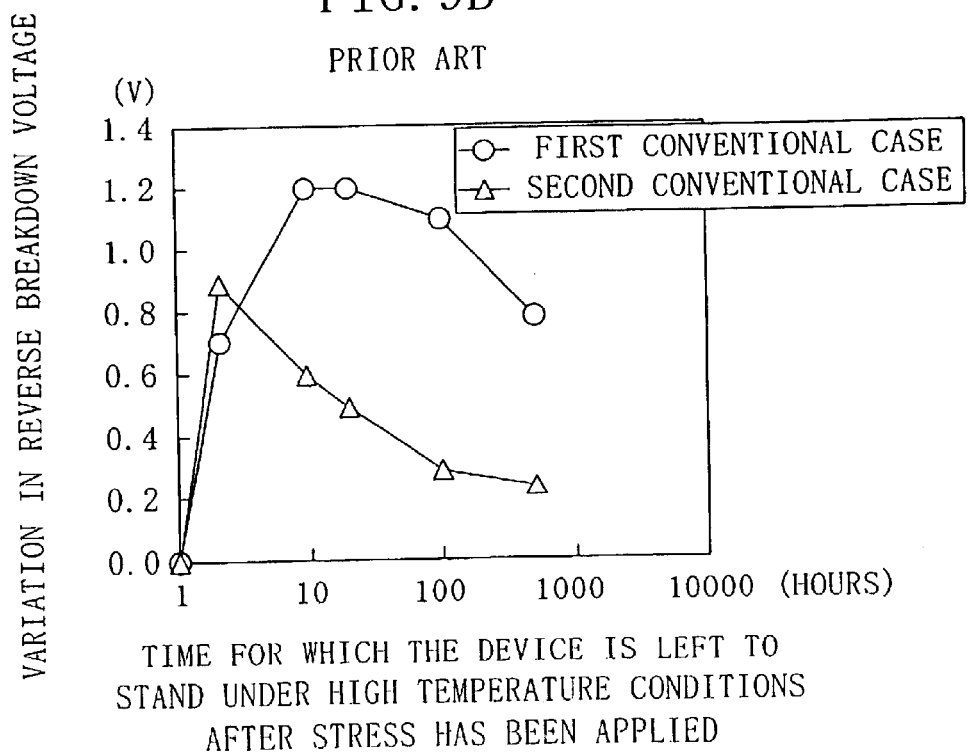

Then, as shown in FIG. 6D, a lithography and dry etching process is carried out so that a contact hole is formed in a portion of the interlevel dielectric film 15 that is located on the n-type doped layer 13A, thereby exposing part of the n-type doped layer 13A through the contact hole. A sputtering or CVD process is then performed in order to fill the contact hole with tungsten, thereby forming a plug 16. Thereafter, an aluminum film is deposited on the interlevel dielectric film 15 and then patterned in such a manner that the aluminum film is connected to the plug 16. In this way, an interconnect 17 is formed on the interlevel dielectric film 15.

The constant voltage that determines the device characteristics for the constant voltage device is obtained by continuously applying a positive voltage to the n-type doped layer 13A via the interconnect 17 until the voltage between the n-type doped layer 13A and the semiconductor substrate 11 reaches the reverse breakdown voltage of a diode structure created by a pn junction formed between the n-type and p-type doped layers 13A and 14.

In the constant voltage device of the second embodiment as in the constant voltage device of the first embodiment, the reverse breakdown voltage at the diode structure created by the pn junction formed between the n-type and p-type doped layers 13A and 14 can be adjusted easily. Thus, in determining the constant voltage of the constant voltage device, a desired constant voltage can be easily obtained.

The n-type doped layer 13A is formed in such a manner that the offset region C is provided, that is, the n-type doped layer 13A is spaced apart from the isolating insulator film 12. Thus, the position at which reverse junction breakdown occurs in the diode structure formed by the pn junction between the n-type and p-type doped layers 13A and 14, can be completely separate from the isolating insulator film 12. This therefore almost ensures that electrons and holes generated by junction breakdown are prevented from being injected into the isolating insulator film 12. Accordingly, when a reverse voltage is applied, electrons and holes are prevented from entering the isolating insulator film 12, thereby significantly suppressing variation with time in strength of the electric field in the pn junction formed by the n-type and p-type doped layer 13A and 14. As a consequence, it can be substantially ensured that variation in the reverse breakdown voltage is prevented.

Moreover, since the offset region C is provided for the n-type doped layer 13A, the pn junction formed by the n-type and p-type doped layers 13A and 14 does not come into contact with the isolating insulator film 12. Consequently, it is possible to suppress leakage current caused by interface states or defects present at the interface between the isolating insulator film 12 and the semiconductor substrate 11.

Further, since the constant voltage device of this embodiment has a structure in which the p-type doped layer 14 is interposed between the isolating insulator film 12 and the n-type doped layer 13A, the depletion layer is suppressed from expanding to reach the semiconductor substrate 11, thereby preventing a punch-through between the constant voltage device and an adjacent device (not shown).

As described above, according to the second embodiment, reverse breakdown voltage can be easily adjusted. Further, the position at which reverse junction breakdown occurs is kept apart from the isolating insulator film 12. Therefore, it can be substantially ensured that electrons and holes generated by junction breakdown are prevented from being injected into the isolating insulator film 12.

In the second embodiment as in the first embodiment, only one plug 16 is formed to be connected to the n-type doped layer 13A, however, the present invention is not limited thereto. A plurality of plugs may be formed for the n-type doped layer 13A.

Also, the p-type doped layer 14 is formed to be in contact with the isolating insulator film 12 surrounding the p-type doped layer 14. The present invention, however, is not limited thereto, but the same effects can be achieved when the p-type doped layer 14 is formed to be kept apart from the side face of the isolating insulator film 12.

Furthermore, the same effects are off course attainable when the p-type semiconductor substrate 11, the n-type doped layer 13A and the p-type doped layer 14 are each of the opposite conductivity.

In addition, although in this embodiment the ion implantation for forming the p-type doped layer 14 is carried out before performing the ion implantation for forming the n-type doped layer 13A, the ion implantations may be performed in the reverse order.

Moreover, although the diode structure, that is, the active region 10, in the constant voltage device, is directly formed in the semiconductor substrate 11, the present invention is not limited thereto. The active region 10 may be provided in another semiconductor region formed on or over the semiconductor substrate 11.

What is claimed is:

1. A semiconductor device comprising: an active layer and an isolating insulator film directly connected to said active layer, said active layer including a high-concentration doped layer directly connected to a low-concentration doped layer having a conductivity type different than said high-concentration doped layer, wherein a first portion of said low-concentration doped layer adjacent said isolating insulator film has an ion concentration lower than another portion of said low-concentration doped layer.

2. The device of claim 1, further comprising an offset region located between at least a part of an outer surface of said high-concentration doped layer and said isolating insulator film.

3. The device of claim 2, wherein said offset region includes a portion of said low-concentration doped layer.

4. The device of claim 1, wherein a second portion of said low-concentration doped layer adjacent a top surface of said low-concentration doped layer has an ion concentration lower than another portion of said low-concentration doped layer.

5. The device of claim 1, wherein said low-concentration doped layer is formed at least under the high-concentration doped layer.

6. A semiconductor device comprising: a high-concentration doped layer, a low-concentration doped layer having a conductivity type different than said high-concentration doped layer, and an isolating insulator film, wherein said high-concentration doped layer is directly connected to said low-concentration doped layer and not directly connected to said isolating insulator film.

7. The device of claim 6, wherein a portion of said low-concentration doped layer is between said isolating insulator film and said high-concentration doped layer.

8. The device of claim 6, wherein a portion of said low-concentration doped layer adjacent said isolating insulator film has an ion concentration lower than another portion of said low-concentration doped layer.

9. The device of claim 6, wherein a portion of said low-concentration doped layer adjacent a top surface of said low-concentration doped layer has an ion concentration lower than another portion of said low-concentration doped layer.

10. The device of claim 6, wherein said low-concentration doped layer is formed at least under said high-concentration doped layer.

11. A method for manufacturing a semiconductor device comprising the steps of: forming an isolating insulator film in a semiconductor substrate so that said isolating insulator film is connected to an active region, forming a high-concentration doped layer in the active region, and forming a low-concentration doped layer having a conductivity type different than said high-concentration doped layer so that said low-concentration doped layer is connected to said high-concentration doped layer in the active region, wherein the step of forming a low-concentration doped layer includes forming a first portion of said low-concentration doped layer adjacent said isolating insulator film, the first portion having an ion concentration lower than another portion of said low-concentration doped layer.

12. The method of claim 11, wherein the step of forming a low-concentration doped layer is performed by rotational ion-implantation with tilt.

13. The method of claim 12, wherein the tilt is not less than 20 degrees with respect to a line perpendicular to the surface of said semiconductor substrate.

14. The method of claim 11, wherein the step of forming a high-concentration doped layer includes forming an offset region located between at least a part of an outer surface of said high-concentration doped layer and said isolating insulator film.

15. The method of claim 14, wherein said offset region includes a portion of said low-concentration doped layer.

16. The method of claim 11, wherein the step of forming a low-concentration doped layer includes forming a second portion of said low-concentration doped layer adjacent a top surface of said low-concentration doped layer, the second portion having an ion concentration lower than another portion of said low-concentration doped layer.

17. The method of claim 11, wherein the step of forming a low-concentration doped layer includes forming the low-concentration doped layer at least under the high-concentration doped layer.

18. A method for manufacturing a semiconductor device comprising the steps of: forming an isolating insulator film in a semiconductor substrate, forming a high-concentration doped layer in the semiconductor substrate in such a manner that said high-concentration doped layer is not directly connected to said isolating insulator film, and forming a low-concentration doped layer having a conductivity type different than said high-concentration doped layer in the semiconductor substrate so that low-concentration doped layer is directly connected to said high-concentration doped layer.

19. The method of claim 18, wherein the step of forming a low-concentration doped layer is performed by rotational ion-implantation with tilt.

20. The method of claim 19, wherein the tilt is not less than 20 degrees with respect to a line perpendicular to the surface of said semiconductor substrate.

21. The method of claim 18, wherein the step of forming a low-concentration doped layer includes forming a portion of said low-concentration doped layer between said isolating insulator film and said high-concentration doped layer.

22. The method of claim 18, wherein the step of forming a low-concentration doped layer includes forming a portion of said low-concentration doped layer adjacent said isolating insulator film, the portion having an ion concentration lower than another portion of said low-concentration doped layer.

23. The method of claim 18, wherein the step of forming a low-concentration doped layer includes forming a portion of said low-concentration doped layer adjacent a top surface of said low-concentration doped layer, the portion having an ion concentration lower than another portion of said low-concentration doped layer.

24. The method of claim 18, wherein the step of forming a low-concentration doped layer includes forming the low-concentration doped layer at least under the high-concentration doped layer.

* * * * *